United States Patent [19]
Kubo et al.

[11] Patent Number: 5,972,741
[45] Date of Patent: Oct. 26, 1999

[54] METHOD OF MANUFACTURING SEMICONDUCTOR DEVICE

[75] Inventors: Hirotoshi Kubo; Eiichiroh Kuwako; Masanao Kitagawa; Masahito Onda; Hiroaki Saitou; Keita Odajima, all of Osaka, Japan

[73] Assignee: Sanyo Electric Co., Ltd., Osaka, Japan

[21] Appl. No.: 08/958,992

[22] Filed: Oct. 28, 1997

[30] Foreign Application Priority Data

Oct. 31, 1996 [JP] Japan .................................... 8-290712
Nov. 15, 1996 [JP] Japan .................................... 8-304891

[51] Int. Cl.⁶ ........................ H01L 21/352; H01L 21/336
[52] U.S. Cl. ............................ 438/138; 438/268; 438/279
[58] Field of Search ................................ 438/138, 268, 438/279, 700

[56] References Cited

U.S. PATENT DOCUMENTS

| | | | |
|---|---|---|---|
| 5,026,659 | 6/1991 | Lee | 437/52 |
| 5,082,795 | 1/1992 | Temple | 437/41 |
| 5,156,993 | 10/1992 | Su | 437/52 |
| 5,182,234 | 1/1993 | Meyer | 437/233 |
| 5,225,363 | 7/1993 | Riemenschneider et al. | 437/47 |
| 5,234,856 | 8/1993 | Gonzalez | 437/47 |
| 5,283,201 | 2/1994 | Tsang et al. | 437/41 |
| 5,514,604 | 5/1996 | Brown | 437/40 |
| 5,578,508 | 11/1996 | Baba et al. | 437/35 |
| 5,648,283 | 7/1997 | Tsang et al. | 437/40 |
| 5,696,010 | 12/1997 | Malhi | 437/40 |
| 5,756,386 | 5/1998 | Blanchard | 438/270 |
| 5,849,621 | 12/1998 | Gardner et al. | 438/279 |
| 5,891,776 | 4/1999 | Han et al. | 438/274 |

*Primary Examiner*—John F. Niebling
*Assistant Examiner*—Michael S. Lebentritt
*Attorney, Agent, or Firm*—Wenderoth, Lind & Ponack, L.L.P.

[57] ABSTRACT

A first conductivity layer and a first insulating film are successively formed on a channel layer, and a photoresist film is formed on the first insulating film. The photoresist film is selectively exposed to light using a photomask and patterned. Using the patterned photoresist film as a mask, the first insulating film and the first conductivity layer are etched to form source electrodes from the first conductivity layer. Using the first insulating film and the source electrodes as a mask, an impurity of one conductivity type is diffused into exposed portions of the channel layer to form source regions. A second insulating film is formed in covering relation to side walls and upper surfaces of the source electrodes. Using the second insulating film as a mask, the channel layer and the common drain layer are etched to form trenches in the source regions, the channel layer, and the common drain layer. A third insulating film is formed on surfaces of the trenches, and a second conductive layer is formed as a gate electrode on the entire surface so as to fill up the trenches and cover the second insulating film.

8 Claims, 10 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a trench-type power MOSFET (metal-oxide-semiconductor field-effect transistor).

2. Description of the Prior Art

Figure 1:
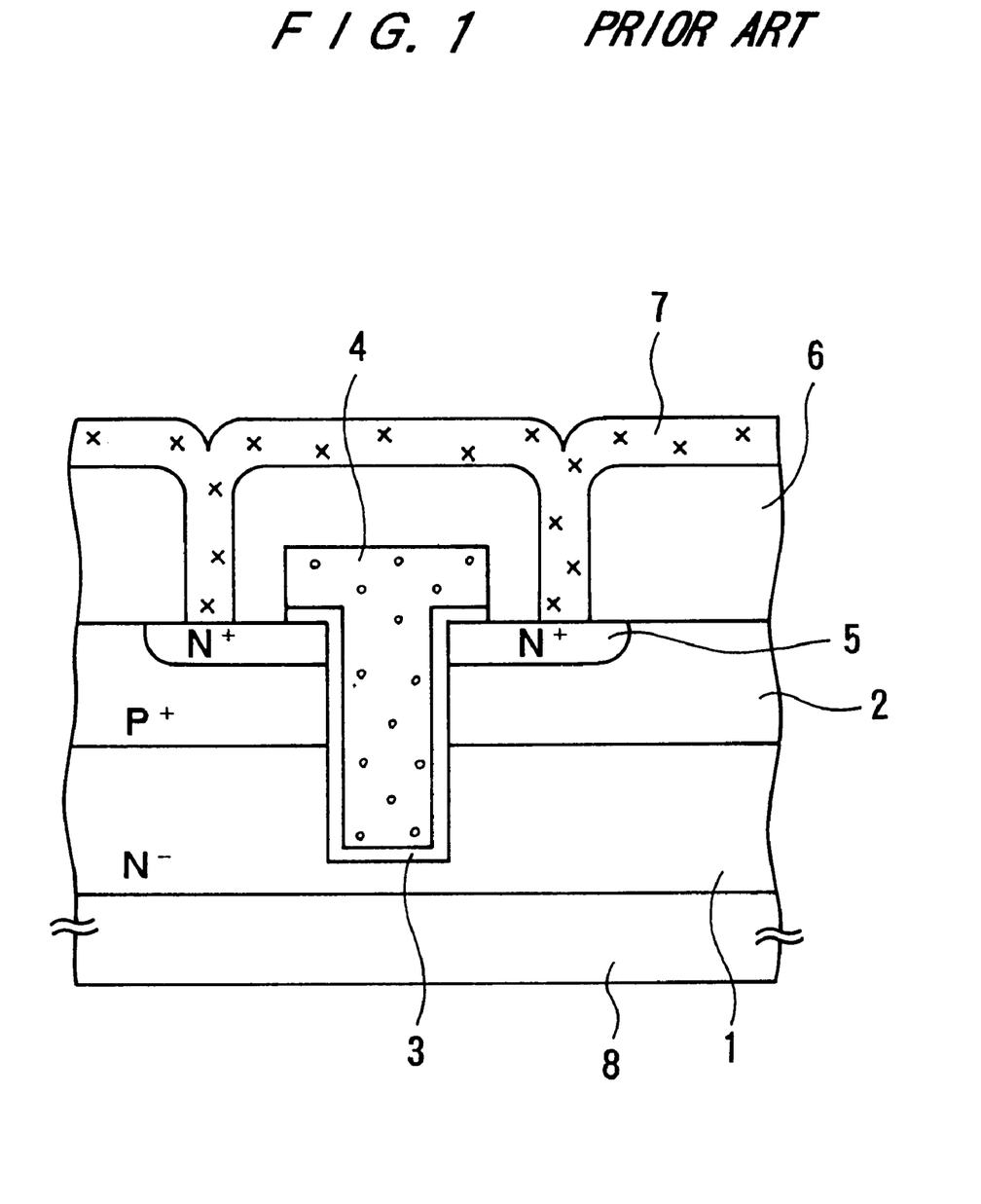
FIG. 1 is a fragmentary cross-sectional view of a conventional semiconductor device.

One conventional semiconductor device will be described below with reference to FIG. 1 of the accompanying drawings. FIG. 1 shows a power MOSFET having a trench structure.

As shown in FIG. 1, the power MOSFET has a common $N^-$-type drain layer 1 deposited on the surface of an $N^+$-type semiconductor substrate 8 by epitaxial growth, and a channel layer 2 that is formed in a surface layer of the common $N^-$-type drain layer 1 by diffusing a $P^+$-type impurity therein. A source region 5 is formed in a surface layer of the channel layer 2 by diffusing an $N^+$-type impurity therein. The power MOSFET includes a trench defined vertically in the common $N^-$-type drain layer 1, the channel layer 2, and the source region 5. The surface of the trench is covered with a gate insulating film 3, on which there is deposited a polysilicon gate 4 that fills the trench.

The polysilicon gate 4, the channel layer 2, and the source region 5 are covered with an interlayer insulating film 6 which has contact holes defined therein over the source region 5. An interconnection layer 7 is deposited on the interlayer insulating film 6 and in the contact holes in contact with the source region 5.

Heretofore, the conventional power MOSFET has been manufactured by a fabrication process that comprises the steps of (1) forming a guard ring, (2) separating a device region, (3) forming a channel layer in the device region, (4) forming a body region, (5) diffusing an impurity to form a source region, (6) forming a trench, (7) forming a gate electrode, (8) forming contact holes in an interlayer insulating film for connection to the source region, and (9) patterning an interconnection layer. In each of these steps, there has been required a photomask that is indispensable for a photolithographic process for patterning a deposited layer or layers. Therefore, the fabrication process has necessitated a total of nine photomasks.

These required photomasks and associated procedures for handling the photomasks have made the fabrication process highly complex, with the result that it is relatively expensive to manufacture the conventional power MOSFET.

SUMMARY OF THE INVENTION

It is therefore an object of the present invention to provide a method of manufacturing a semiconductor device relatively inexpensively with a small number of photomasks.

To achieve the above object, there is provided in accordance with the present invention a method of manufacturing a semiconductor device, comprising the steps of forming a channel layer of one conductivity type on a surface of a semiconductor substrate; forming a mask layer having a plural of openings on said semiconductor substrate; forming an insulating film on said mask layer to cover said openings of said mask layer; etching said insulating film to form side walls beside walls of said mask layer; etching said semiconductor substrate to form trenches extending through said channel layer of said semiconductor substrate using said side walls as a mask. The mask layer may be formed as a polysilicon or a polycide layer.

According to the present invention, there is also provided a method of manufacturing a semiconductor device, comprising the steps of forming a common drain layer of one conductivity type on a surface of a semiconductor substrate of the one conductivity type, diffusing a first impurity of a conductivity type different from the one conductivity type into an entire surface of the common drain layer to form a channel layer thereon, forming a first conductivity layer on the channel layer, forming a first insulating film on the first conductivity layer, forming a photoresist film on the first insulating film, selectively exposing the photoresist film to light using a photomask and patterning the photoresist film, etching the first insulating film and the first conductivity layer to form source electrodes from the first conductivity layer, using the patterned photoresist film as a mask, diffusing a second impurity of the one conductivity type into exposed portions of the channel layer to form source regions, using the first insulating film and the source electrodes as a mask, forming a second insulating film in covering relation to side walls and upper surfaces of the source electrode, etching the channel layer and the common drain layer to form trenches in the source regions, the channel layer, and the common drain layer, using the second insulating film as a mask, forming a third insulating film on surfaces of the trenches, forming a second conductive layer as a gate electrode on the entire surface so as to fill up the trenches and cover the second insulating film, and forming an interconnection layer on the second conductive layer.

The first conductive layer may be formed as a polysilicon or a polycide layer, and the first insulating film is formed as a silicon oxide film produced by oxidizing the first conductive layer.

The second insulating film may be formed by oxidizing the entire surface to form a silicon oxide film and thereafter etching the entire surface to remove the silicon oxide film from the source regions thereby removing at least portions of the source regions.

The third insulating film may be formed by oxidizing the surfaces of the trench to form a silicon oxide film as the third insulating film.

According to the present invention, there is also provided a method of manufacturing a semiconductor device, comprising the steps of forming a common drain layer of one conductivity type on a surface of a semiconductor substrate of the one conductivity type, forming a first conductive layer on the common drain layer, forming a first insulating film on the first conductive layer, forming a photoresist film on the first insulating film, exposing the photoresist film to light and developing the photoresist film to expose portions of the first insulating film, removing the exposed portions of the first insulating film to form source electrodes from remaining portions of the first insulating film, introducing a first impurity of a conductivity type different from the one conductivity type into exposed portions of the common drain layer, using the source electrodes as a mask, and diffusing the first impurity to form channel regions, introducing a second impurity of the one conductivity type into the exposed portions of the common drain layer, using the source electrodes as a mask, and diffusing the second impurity to form source regions, forming a second insulating film in covering relation to side walls and upper surfaces of the source electrodes, forming trenches in the channel regions, the source regions, and the common drain layer, forming a third insulating film on surfaces of the trenches, and forming a second conductive layer as a gate electrode on the entire surface so as to fill up the trenches and cover the second insulating film.

The first impurity and the second impurity may be simultaneously thermally diffused.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

First, a trench-type power MOSFET which has been manufactured by a method according to a first embodiment of the present invention will be described below with reference to FIG. 2.

Figure 2:
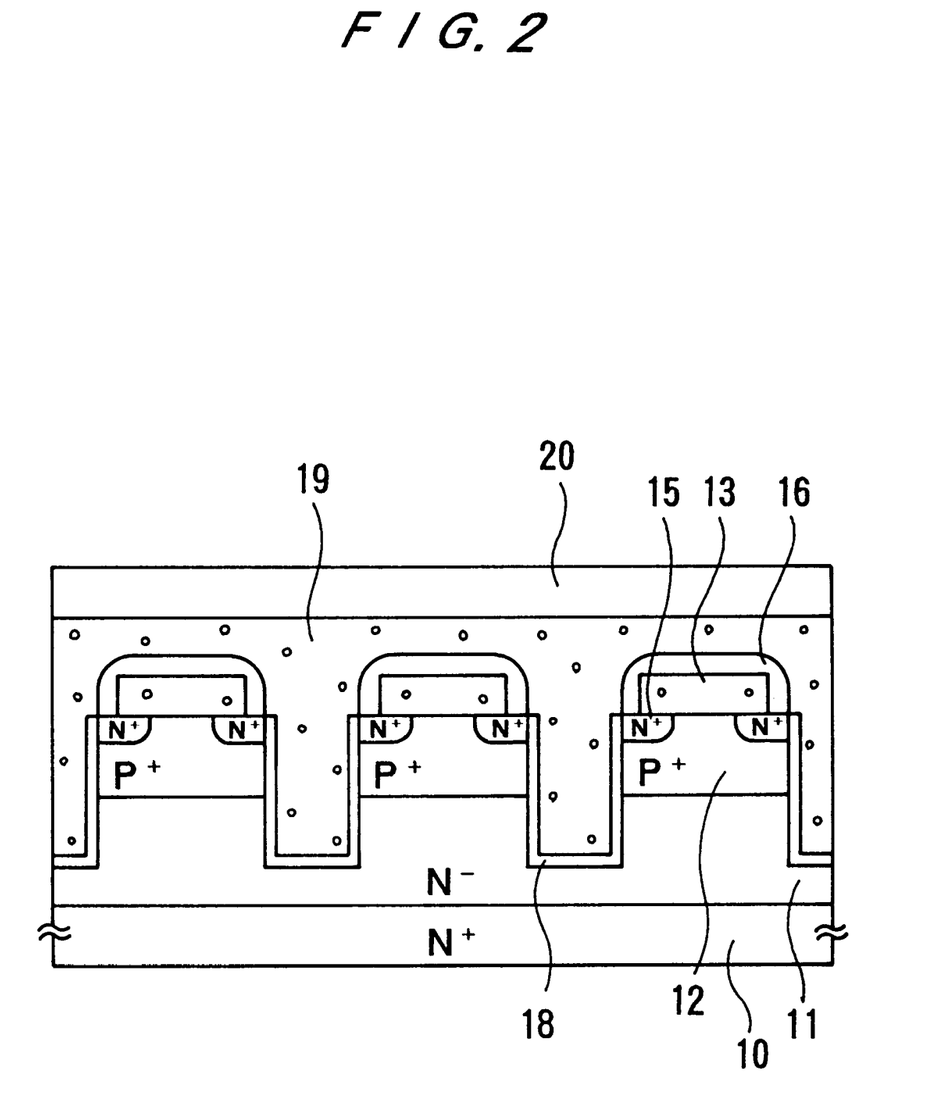
FIG. 2 is a fragmentary cross-sectional view of a trench-type power MOSFET which has been manufactured by a method according to a first embodiment of the present invention.

As shown in FIG. 2, the trench-type power MOSFET has a common $N^-$-type drain layer 11 deposited on the surface of an $N^+$-type semiconductor substrate 10 of silicon by epitaxial growth, and a channel layer 12 that is formed in a surface layer of the common $N^-$-type drain layer 11 by diffusing a $P^+$-type impurity therein. The power MOSFET includes a plurality trenches defined vertically in the common $N^-$-type drain layer 11 and the channel layer 12. The surface of each of the trenches is covered with a gate insulating film 18 which comprises a silicon oxide film having a thickness of about 500 Å.

A plurality of surface areas of the channel layer 12 which have been divided by the trenches include source regions 15 each comprising an $N^+$-type impurity-diffused layer. Source electrodes 13, each comprising a polysilicon layer having a thickness of about 5000 Å, are deposited on the respective surface areas in contact with the source regions 15.

The source electrodes 13 are covered with respective insulating films 16 each comprising a silicon oxide film having a thickness of about 5000 Å. A gate electrode 19 of polysilicon is deposited on the gate insulating films 18 and the insulating films 16, filling up the trenches. An interconnection layer 20 of aluminum having a thickness of about 1 μm is deposited on the gate electrode 19.

The method according to the first embodiment of the present invention for fabricating the trench-type power MOSFET shown in FIG. 2 will be described below with reference to FIGS. 3 through 9. In FIGS. 3 through 9, the $N^+$-type semiconductor substrate 10 is omitted from illustration for the sake of brevity.

Figure 3:
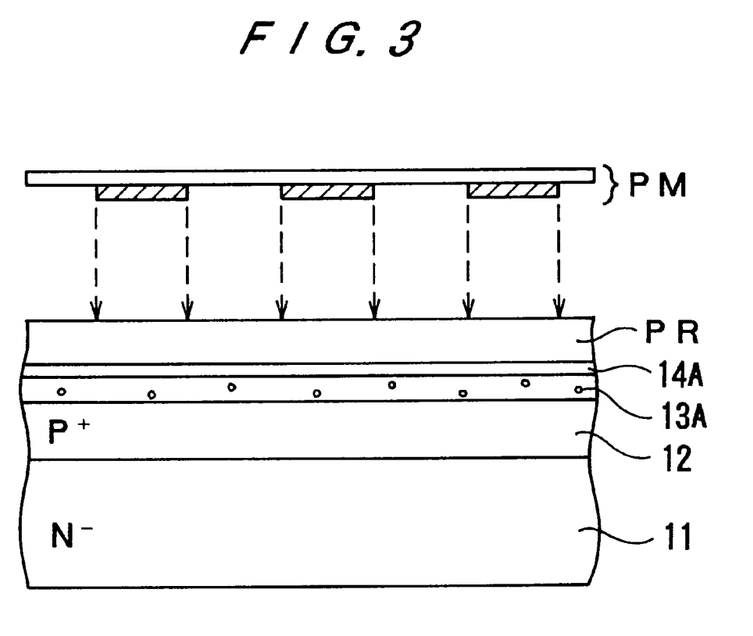
FIGS. 3 through 9 are fragmentary cross-sectional views of successive steps of the method according to the first embodiment of the present invention.
Figure 4:
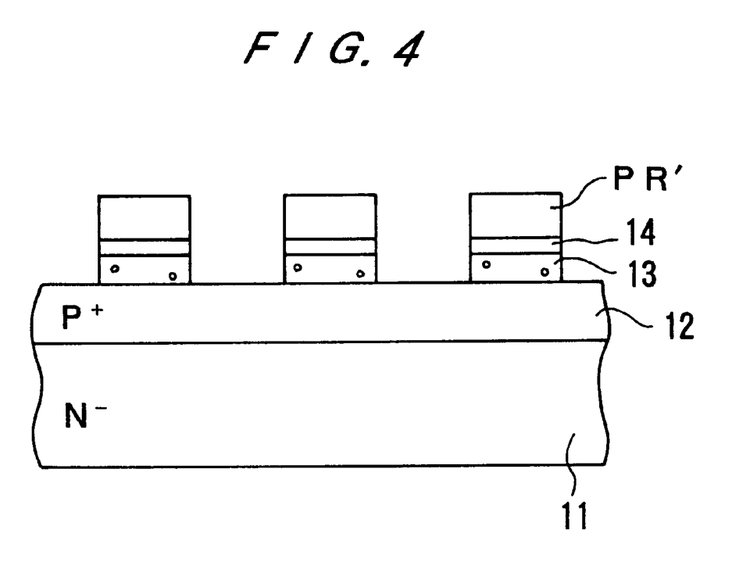

As shown in FIG. 3, after a common $N^-$-type drain layer 11 is deposited on the surface of an $N^+$-type semiconductor substrate 10 of silicon by epitaxial growth, a $P^+$-type impurity of $B^+$ is diffused into the entire surface layer of the common $N^-$-type drain layer 11 at a dose of $5 \times 10^{13}$ cm$^{-2}$, forming a channel layer 12. Then, a polysilicon layer 13A is deposited to a thickness of about 5000 Å on the channel layer 12 by CVD (chemical vapor deposition) or the like. Thereafter, the polysilicon layer 13A is oxidized to form an oxide layer 14A having a thickness of about 5000 Å thereon, after which a photoresist film PR is coated to a thickness of about 1 μm on the upper surface of the oxide layer 14A. Using a first photomask PM, the photoresist film PR is selectively exposed to light in areas other than those where source electrodes will subsequently be formed.

The photoresist film PR is then developed into a photoresist film PR' (see FIG. 4) to remove the exposed areas. Using the photoresist film PR' as a mask, the oxide layer 14A and the polysilicon layer 13A are successively etched to form oxide layers 14 and source electrodes 13 that are patterned.

Figure 5:
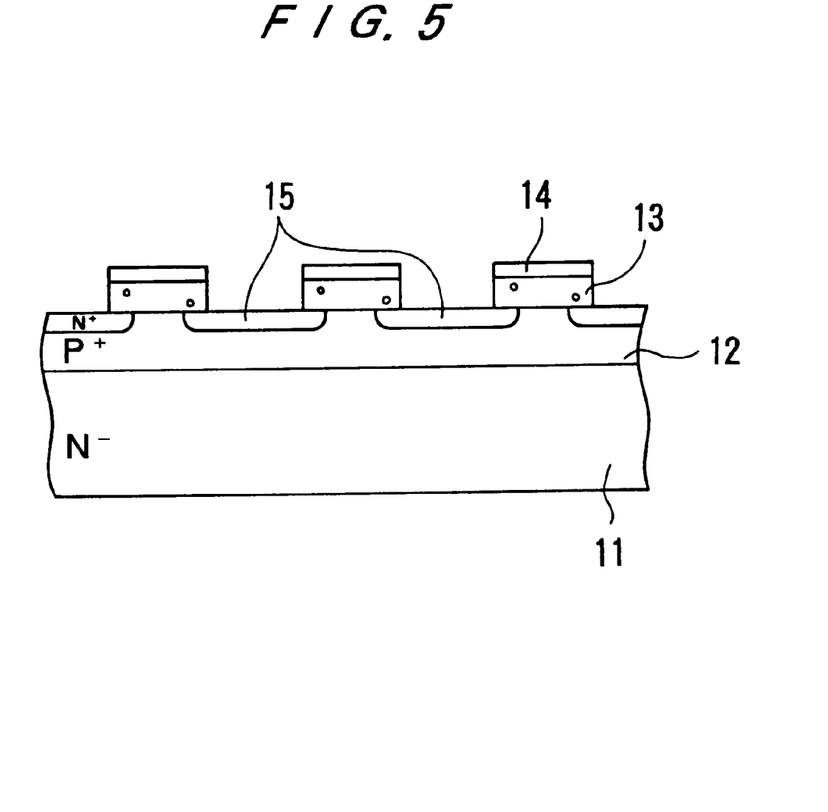
Figure 6:
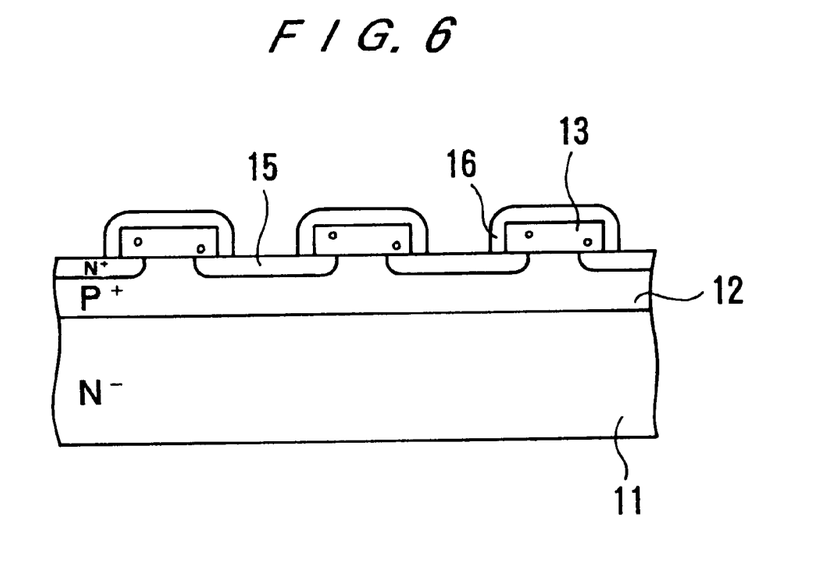

After the photoresist film PR' is removed, as shown in FIG. 5, using the oxide layers 14 and the source electrodes 13 as a mask, an $N^+$-type impurity of As (arsenic), for example, is diffused into the surface layer of the channel layer 12 at a dose of $1 \times 10^{16}$ cm$^{-2}$, forming source regions 15.

The surface formed so far is oxidized to form a silicon oxide film having a thickness of about 8000 Å thereon, and those portions of the silicon oxide film which lie over the source regions 15 are etched away by dry etching, exposing the source regions 15. Now, silicon oxide spacers are left on the side walls of the source electrode 13, and integrally united with the oxide films 14 on the upper surfaces of the source electrodes 13, thus making up insulating films 16 (see FIG. 6) covering the source electrodes 13.

Figure 7:
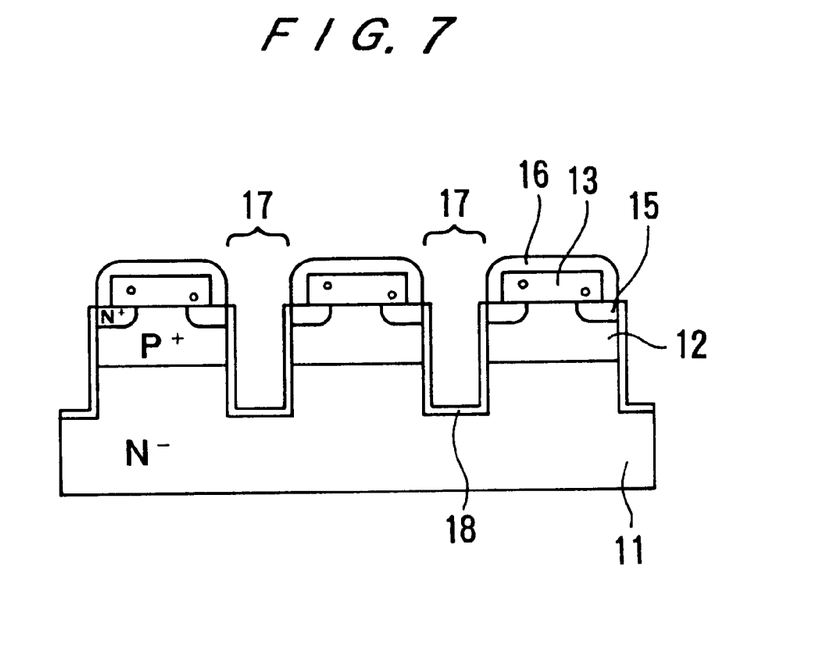
Figure 8:
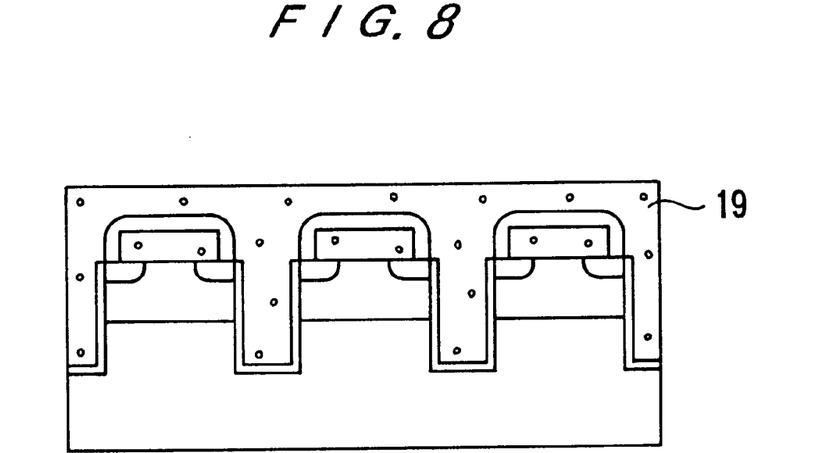

Then, as shown in FIG. 7, the channel layer 12 and the common drain layer 12 are subjected to a dry etching process using the insulating films 16 as a mask, forming trenches 17 in the channel layer 12 and the common drain layer 12. Each of the trenches 17 has a depth of about 3 μm. Thereafter, the surfaces of the trenches 17 are thermally oxidized into gate insulating films 18 having a thickness of about 500 Å. The thickness of the gate insulating films 18 is selected for the power MOSFET which has a breakdown voltage of 30 V, and depends upon the breakdown voltage of the power MOSFET that is to be manufactured.

Thereafter, a polysilicon layer is deposited on the overall surface formed so far by CVD or the like, producing a gate electrode 19 (see FIG. 8) of polysilicon that fills up the trenches 17 and covering the insulating films 16.

Figure 9:
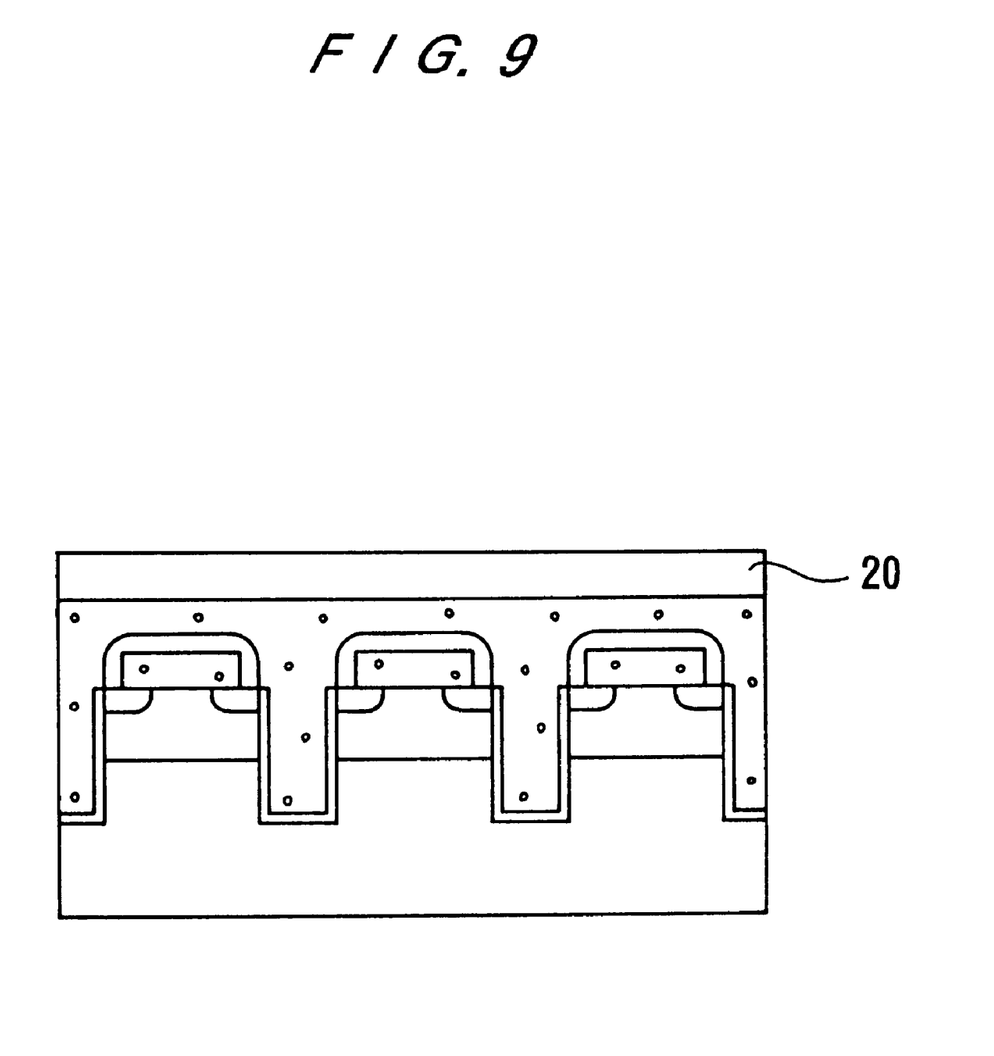

Subsequently, as shown in FIG. 9, an interconnection layer 20 of aluminum is deposited to a thickness of about 1 μm on the entire surface of the gate electrode 19 by sputtering or the like.

A photoresist film (not shown) is coated on the surface of the interconnection layer 20, and then patterned according to a photolithographic process using a second photomask (not shown). Then, using the patterned photoresist film as a mask, the interconnection layer 20 and the gate electrode 19 are selectively etched away, thereby completing the power MOSFET shown in FIG. 2.

A method according to a second embodiment of the present invention will be described below with reference to FIGS. 10 through 16.

Figure 10:
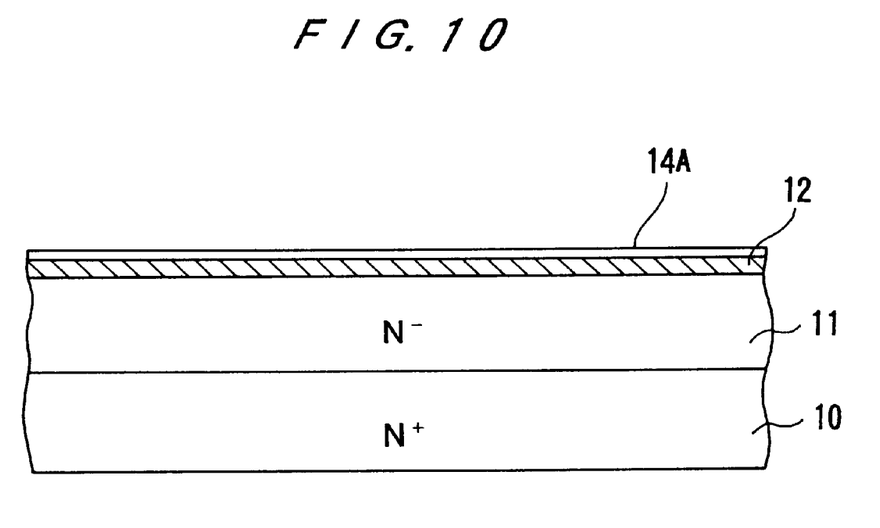
FIGS. 10 through 16 are fragmentary cross-sectional views of successive steps of a method according to a second embodiment of the present invention.

As shown in FIG. 10, a common $N^-$-type drain layer 11 is deposited on the surface of an $N^+$-type semiconductor substrate 10 of silicon by epitaxial growth. Then, a polysilicon layer 12, i.e., a first conductive layer which will be serve as source electrodes, is deposited to a thickness of about 5000 Å on the epitaxial layer 11 by CVD or the like. Thereafter, a first oxide layer 14A having a thickness of about 5000 Å is formed on the polysilicon layer 12 by CVD or the like.

Figure 11:
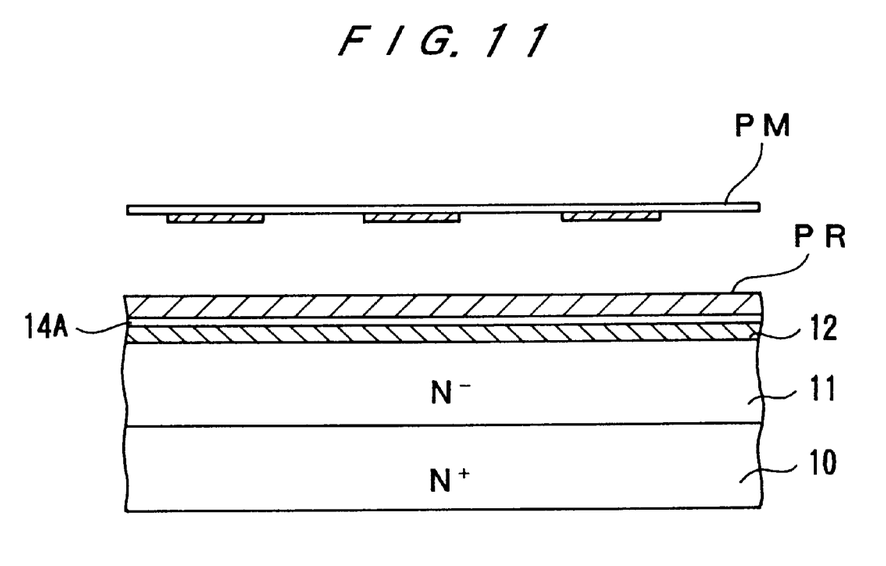
Figure 12:
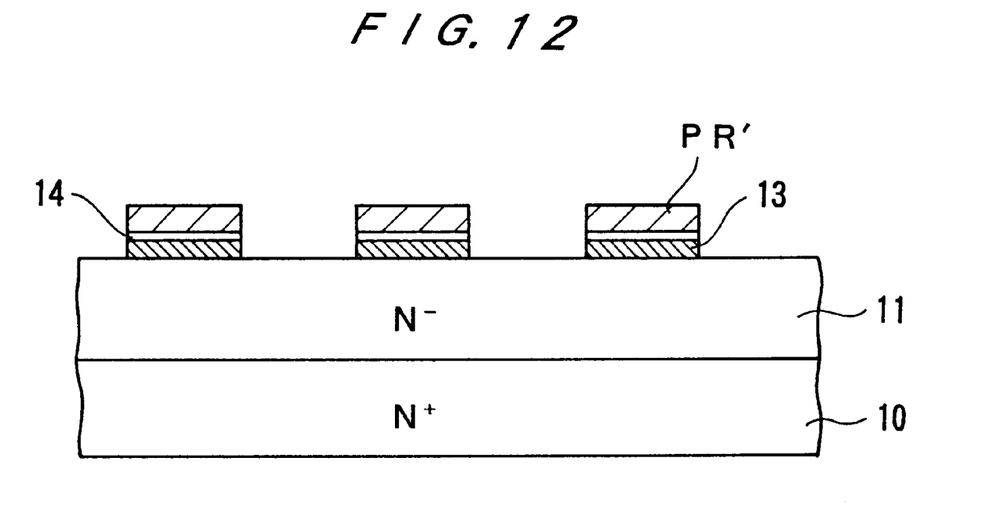

Then, as shown in FIG. 11, a photoresist film PR is coated to a thickness of about 1 μm on the upper surface of the oxide layer 14A. Using a first photomask PM, the photoresist film PR is selectively exposed to light in areas other than those where source electrodes will subsequently be formed. After the exposed areas are removed, the oxide layer 14A and the polysilicon layer 12 are successively etched to form oxide layers 14 and source electrodes 13 that are patterned, using a remaining photoresist film PR' as a mask, as shown in FIG. 12.

Figure 13:
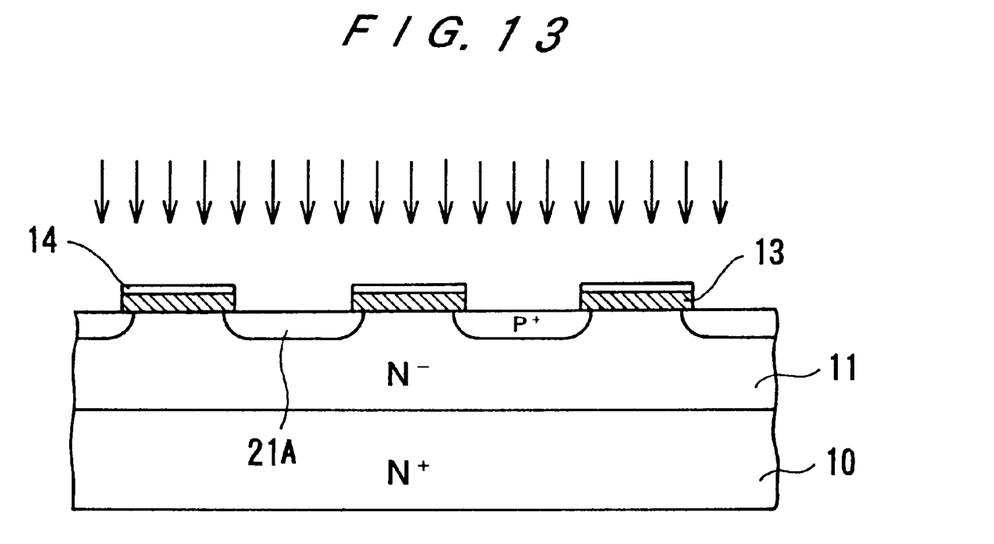

Then, as shown in FIG. 13, the remaining photoresist film PR' is removed, and using the oxide layers 14 and the source electrodes 13 as a mask, a $P^+$-type impurity of B (boron), for example, is implanted into the surface layer of the drain layer 11 at a dose of $5 \times 10^{13}$ cm$^{-2}$, forming impurity-diffused regions 21A in the drain layer 11 The $P^+$-type impurity may be thermally diffused after it is implanted. In this embodiment, however, the implanted $P^+$-type impurity will be thermally diffused at the same time that an impurity implanted to form source regions (described later on) will be thermally diffused.

Figure 14:
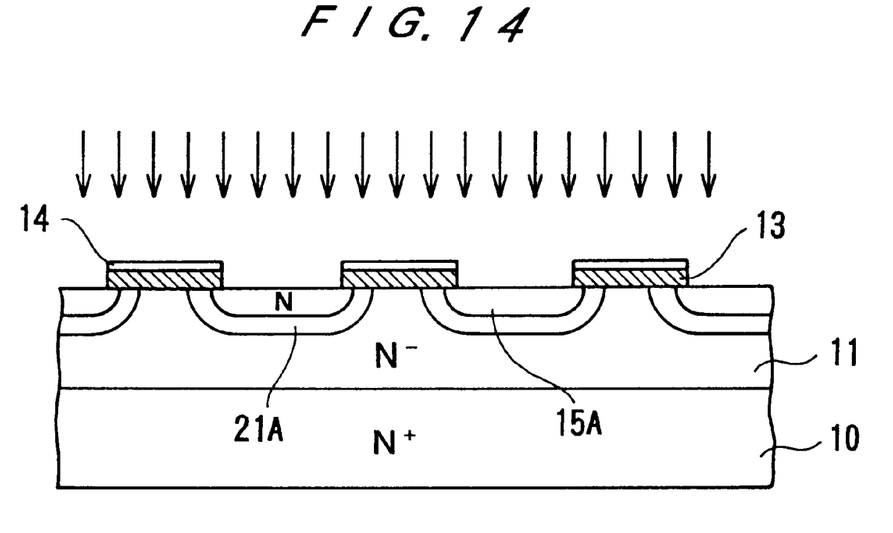

Then, as shown in FIG. 14, using the oxide layers 14 and the source electrodes 13 as a mask again, an $N^+$-type impurity of As, for example, is implanted into the impurity-diffused regions 21A at a dose of $1 \times 10^{16}$ cm$^{-2}$, forming impurity-diffused regions 15A therein. Thereafter, the implanted $P^+$- and $N^+$-type impurities in the impurity-diffused regions 15A, 21A are simultaneously thermally diffused.

Figure 15:
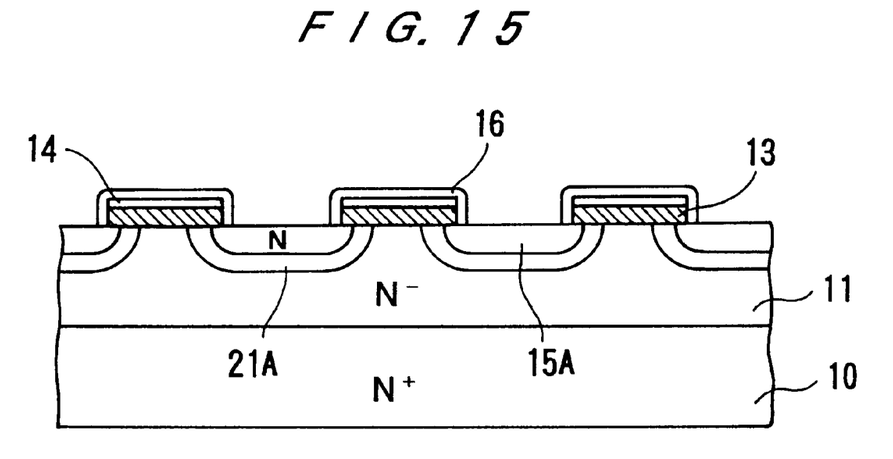

As shown in FIG. 15, a second oxide layer 16 which comprises a silicon oxide film having a thickness of about 8000 Å is formed on the entire surface formed so far by CVD or the like. Then, those portions of the second oxide layer 16 placed over the impurity-diffused regions 15A, 21A and sandwiched between the source electrodes 13 are etched away, exposing the surfaces of the impurity-diffused regions 15A. The source electrodes 13 now have their upper surfaces and side walls covered and protected by the silicon oxide films 16 thereon.

Figure 16:
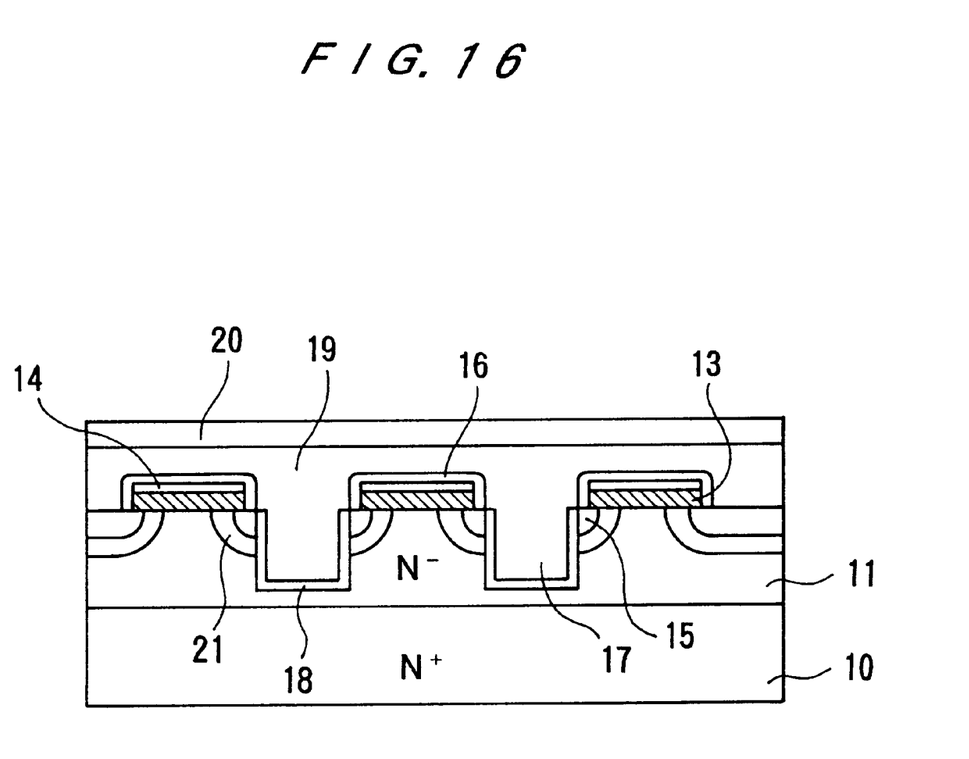

Then, as shown in FIG. 16, using the silicon oxide films 16 on the source electrodes 13 as a mask, trenches 17 are formed in the impurity-diffused regions 15A, 21A, dividing the impurity-diffused regions 15A, 21A into P-type channel regions 21 and N-type source regions 15. Each of the trenches 17 has a depth of about 3 μm. The depth of each of the trenches 17 is determined by the thickness of the drain layer 11, and may be of any value insofar as the trenches 17 do not extend to the semiconductor substrate 10.

Thereafter, the surfaces of the trenches 17 are thermally oxidized into gate insulating films 18 having a thickness of about 500 Å. The gate insulating films 18 serve as a third oxide film. The thickness of the gate insulating films 18 is selected for the power MOSFET which has a breakdown voltage of 30 V, and depends upon the breakdown voltage of the power MOSFET that is to be manufactured.

Thereafter, a polysilicon layer is deposited on the overall surface formed so far by CVD or the like, producing a gate electrode 19 of polysilicon that fills up the trenches 17 and covering the insulating film 16.

Subsequently, an interconnection layer 20 of aluminum is deposited to a thickness of about 1 μm on the entire surface of the gate electrode 19 by sputtering or the like.

A photoresist film (not shown) is coated on the surface of the interconnection layer 20, and then patterned according to a photolithographic process using a second photomask (not shown). Then, using the patterned photoresist film as a mask, the interconnection layer 20 and the gate electrode 19 are selectively etched away, thereby completing the power MOSFET shown in FIG. 16.

The methods according to the present invention offer the following advantages: After the oxide layer and the polysilicon film are patterned into the oxide layers 14 and the source electrodes 13 using the photoresist film PR' which has been patterned using the first photomask PM, almost all the subsequent steps including the step of forming the source regions 15 and the step of forming the trenches 17 can be carried out in a self-aligned manner.

Since only the two photomasks, i.e., the first photomask PM and the second photomask used for patterning the interconnection layer 20, are required, the methods according to the present invention do not need as many masks and associated procedures as required by the conventional fabrication process, and result in a substantial reduction in cost and labor.

The methods according to the present invention do not include any step of separating devices from the fabricated semiconductor power MOSFET wafer. Actually, after the power MOSFET wafer is fabricated, power MOSFET devices are cut from the semiconductor wafer by dicing. Therefore, no photomask is required in machining the fabricated semiconductor power MOSFET wafer into power MOSFET devices.

The methods according to the present invention have been described with respect to the fabrication of an N-channel power MOSFET, the principles of the present invention are also applicable to the fabrication of a vertical power semiconductor device, a P-channel MOSFET, and an IGBT (insulated-gate bipolar transistor).

In the illustrated embodiments, the source electrodes 13 and the gate electrode 19 are made of polysilicon. However, the source electrodes 13 and the gate electrode 19 may be made of polycide or metal.

Although certain preferred embodiments of the present invention have been shown and described in detail, it should be understood that various changes and modifications may be made therein without departing from the scope of the appended claims.

What is claimed is:

1. A method of manufacturing a semiconductor device, comprising the steps of:
    forming a channel layer of one conductivity type on a surface of a semiconductor substrate;
    forming a mask layer having a plural of openings on said semiconductor substrate;
    forming an insulating film on said mask layer to cover said openings of said mask layer;
    etching said insulating film to form side walls beside walls of said openings of said mask layer;
    etching said semiconductor substrate to form trenches extending through said channel layer of said semiconductor substrate using said side walls as a mask.

2. A method according to claim 1, wherein said mask layer is formed as a polysilicon or a polycide layer.

3. A method of manufacturing a semiconductor device, comprising the steps of:
    forming a common drain layer of one conductivity type on a surface of a semiconductor substrate of said one conductivity type;

diffusing a first impurity of a conductivity type different from said one conductivity type into an entire surface of said common drain layer to form a channel layer thereon;

forming a first conductivity layer on said channel layer;

forming a first insulating film on said first conductivity layer;

etching said first insulating film and said first conductivity layer to form source electrodes from said first conductivity layer, diffusing a second impurity of said one conductivity type into exposed portions of said channel layer to form source regions, using said first insulating film and said source electrodes as a mask;

forming a second insulating film in covering relation to side walls and upper surfaces of said source electrode;

etching said channel layer and said common drain layer to form trenches in said source regions, said channel layer, and said common drain layer, using said second insulating film as a mask;

forming a third insulating film on surfaces of said trenches;

forming a second conductive layer as a gate electrode on the entire surface so as to fill up said trenches and cover said second insulating film; and forming an interconnection layer on said second conductive layer.

4. A method according to claim 1, wherein said first conductive layer is formed as a polysilicon or a polycide layer, and said first insulating film is formed as a silicon oxide film produced by oxidizing said first conductive layer.

5. A method according to claim 1, wherein said second insulating film is formed by oxidizing the entire surface to form a silicon oxide film and thereafter etching the entire surface to remove said silicon oxide film from said source regions thereby removing at least portions of said source regions.

6. A method according to claim 1, wherein said third insulating film is formed by oxidizing the surfaces of said trench to form a silicon oxide film as said third insulating film.

7. A method of manufacturing a semiconductor device, comprising the steps of:

forming a common drain layer of one conductivity type on a surface of a semiconductor substrate of said one conductivity type;

forming a first conductive layer on said common drain layer;

forming a first insulating film on said first conductive layer;

removing the exposed portions of said first insulating film to form source electrodes from remaining portions of said first insulating film;

introducing a first impurity of a conductivity type different from said one conductivity type into exposed portions of said common drain layer, using said source electrodes as a mask, and diffusing said first impurity to form channel regions;

introducing a second impurity of said one conductivity type into said exposed portions of said common drain layer, using said source electrodes as a mask, and diffusing said second impurity to form source regions;

forming a second insulating film in covering relation to side walls and upper surfaces of said source electrodes;

forming trenches in said channel regions, said source regions, and said common drain layer;

forming a third insulating film on surfaces of said trenches; and forming a second conductive layer as a gate electrode on the entire surface so as to fill up said trenches and cover said second insulating film.

8. A method according to claim 5, wherein said first impurity and said second impurity are simultaneously thermally diffused.

* * * * *